United States Patent
Waltari

(10) Patent No.: US 7,557,746 B1
(45) Date of Patent: Jul. 7, 2009

(54) TIME DOMAIN INTERPOLATION SCHEME FOR FLASH A/D CONVERTERS

(75) Inventor: Mikko Waltari, San Diego, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/002,153

(22) Filed: Dec. 13, 2007

(51) Int. Cl.
*H03M 1/34* (2006.01)
*H03M 1/50* (2006.01)

(52) U.S. Cl. ...................... 341/158; 341/166

(58) Field of Classification Search ............. 341/155, 341/156, 158, 159, 166
See application file for complete search history.

(56) References Cited

U.S. PATENT DOCUMENTS

| | | | | |
|---|---|---|---|---|
| 4,928,103 A | * | 5/1990 | Lane | 341/159 |
| 5,157,397 A | * | 10/1992 | Vernon | 341/159 |
| 5,291,198 A | * | 3/1994 | Dingwall et al. | 341/159 |
| 6,707,413 B2 | * | 3/2004 | Sushihara et al. | 341/159 |
| 7,420,497 B2 | * | 9/2008 | Chiu | 341/155 |

FOREIGN PATENT DOCUMENTS

JP        04043718 A   *   2/1992

* cited by examiner

*Primary Examiner*—Howard Williams

(57) ABSTRACT

An analog-to-digital converter circuit comprises a first voltage comparator coupled to a first reference voltage and a signal voltage, the first voltage comparator having first negative and first positive outputs for outputting a comparison of the first reference voltage with the signal voltage; a second voltage comparator coupled to a second reference voltage and the signal voltage, the second reference voltage different than the first reference voltage, the second voltage comparator having second negative and second positive outputs for outputting a comparison of the second reference voltage with the signal voltage; and a first arrival time comparator coupled to the first positive output and the second negative output, the first arrival time comparator having a first arrival time comparator output for outputting a comparison of the first positive output with the second negative output.

20 Claims, 6 Drawing Sheets

TIME DOMAIN INTERPOLATION SCHEME FOR FLASH A/D CONVERTERS

BACKGROUND OF THE INVENTION

1. Field of the Invention

The present invention relates to analog-to-digital conversion circuits. More particularly, the present invention relates to flash analog-to-digital conversion circuits.

2. Background Art

The flash architecture is a widely used form of analog-to-digital converter (ADC). Flash ADCs can be used in a standalone fashion, which is often utilized in high-speed applications. More often flash ADCs are used as part of other ADCs, such as pipeline ADCs, folding and interpolating ADCs, subranging ADCs, and multi-bit delta sigma modulators.

A conventional standalone flash ADC is shown in circuit 100 of FIG. 1. Circuit 100 includes two voltage sources, three resistors, three voltage comparators, and an encoder. In operation, reference source 102 can provide a fixed reference voltage to circuit 100. The output of reference source 102 is coupled to the first end of resistor 110, the second end of resistor 110 is coupled to the first end of resistor 112, the second end of resistor 112 is coupled to the first end of resistor 114, and the second end of resistor 114 is coupled to ground 106. In this configuration, resistors 110 through 114 form a voltage divider, and a fixed voltage at a level between the reference source 102 voltage and the ground 106 voltage can exist between the second end and first end of each resistor pair. The voltage between resistors 110 and 112 is lower than the reference source 102 voltage, and the voltage between resistors 112 and 114 is lower than the voltage between resistors 110 and 112.

First voltage comparator 120, second voltage comparator 130, and third voltage comparator 140 each has a reference input, a signal input, and an output. The reference input and the signal input of each voltage comparator can receive analog voltage signals, which in operation are then compared by voltage comparators 120, 130 and 140. If the reference input voltage is higher than the signal input voltage, the voltage comparator output will be set to logic low. Conversely, if the reference input voltage is lower than the signal input voltage, the voltage comparator output will be set to logic high.

The reference input of first voltage comparator 120 is coupled to reference source 102 and to the first end of resistor 110, the reference input of second voltage comparator 130 is coupled to the second end of resistor 110 and the first end of resistor 112, and the reference input of third voltage comparator 140 is coupled to the second end of resistor 112 and the first end of resistor 114. In this configuration, the reference inputs of voltage comparators 120, 130 and 140 each receive a different voltage from the voltage divider. The output of signal source 104 is coupled to the signal input of first voltage comparator 120, to the signal input of second voltage comparator 130, and to the signal input of third voltage comparator 140. In this configuration, the signal inputs of voltage comparators 120, 130 and 140 each receive the same voltage from the output of signal source 104.

In operation, signal source 104 can provide an analog voltage to circuit 100 for conversion to a digital (i.e. logic level) voltage. The voltage output by signal source 104 may be higher or lower than the voltage received by the reference inputs of voltage comparators 120 through 140. For instance, reference input of first voltage comparator 120 receives the reference source 102 voltage. If the reference source 102 voltage is higher than the signal source 104 voltage received by the signal input of first voltage comparator 120, the first voltage comparator 120 output will be set to logic low. Second voltage comparator 130 and third voltage comparator 140 will perform similar comparisons.

Because of the structure of the voltage divider assembled from resistors 110 through 114, the voltage received by the reference input of second voltage comparator 130 is lower than the voltage received by the reference input of first voltage comparator 120, and the voltage received by the reference input of third voltage comparator 140 is lower than the voltage received by the reference input of second voltage comparator 130. Consequently, if the signal source 104 voltage is high enough to make first voltage comparator 120 output a logic high, voltage comparators 130 and 140 also output logic high. Similarly, if the signal source 104 voltage is not high enough to make first voltage comparator 120 output a logic high, but is high enough to make second voltage comparator 130 output a logic high, then the third voltage comparator 140 output will also be logic high.

The result of the analog-to-digital conversion is represented by the cardinality of voltage comparator outputs that are set logic high. For instance, if in operation the signal source 104 voltage exceeds the reference source 102 voltage, then each voltage comparator output will be set logic high, because the signal input of each voltage comparator receives a voltage that exceeds the voltage received by the reference input of each voltage comparator. Thus, in circuit 100, the cardinality of voltage comparator outputs that are set logic high is three (3). However, if the signal source 104 voltage is reduced below the reference source 102 voltage, but remains above the voltage between the second end of resistor 110 and the first end of resistor 112, then the first voltage comparator 120 output will be set logic low, while the remaining voltage comparator 130 and 140 outputs will continue to be logic high. In this fashion, the cardinality of voltage comparator outputs that are set logic high, and thus the result of the analog-to-digital conversion, declines from 3 to 2 as the signal source 104 voltage declines. In circuit 100, this cardinal output (i.e., a base-1 output, or "thermometer code") can be converted by encoder 150 to, for instance, a binary number (i.e., a base-2 output).

One clear disadvantage of flash ADC circuit 100 follows as a consequence of its base-1 voltage comparator output, which is that to be able to resolve N binary digits, flash ADC circuit 100 must be assembled from $2^N-1$ voltage comparators. For example, circuit 100, which can resolve between 2 binary digits on the output of encoder 150, is assembled from three (3) voltage comparators. As the binary resolution of flash ADC circuit 100 increases, the exponential increase in the required number of voltage comparators becomes prohibitively expensive. For instance, a flash ADC that can resolve between eight (8) binary digits would require 255 voltage comparators. This exponential growth in the number of voltage comparators translates directly to exponential growth in circuit die size, to exponential growth in circuit power consumption, and to increasing difficulty in driving the reference source and signal source because of increased capacitive loading.

A number of conventional solutions have been designed that attempt to cope with the problems of increasing circuit size, power, and capacitive loading. One such solution, for example, is seen in circuit 200 of FIG. 2. In circuit 200, reference source 202, signal source 204, ground 206, and the voltage divider assembled from resistors 210 through 214 are functionally similar to their counterparts in circuit 100, as are voltage comparators 220 through 240 and encoder 250. However, instead of directly coupling to voltage comparators 220 through 240, the voltage divider is coupled to an intermediary

3 interpolator stage that can be assembled from, for example, an array of amplifiers 260 through 270 connected to an interpolating network of resistors 280 through 296. The interpolator stage reduces the capacitive load on reference source 202 and signal source 204, because the three amplifiers 260 through 270 are easier to drive than the six subsequent voltage comparators. While circuit 200 is easier to drive than a pure flash ADC, and allows for the use of smaller voltage comparators without sacrificing accuracy, the interpolator stage of circuit 200 also significantly reduces overall conversion speed and bandwidth.

Another conventional solution, namely, the subranging ADC, reduces capacitive loading and circuit size at the cost of significantly increased conversion time. Subranging ADCs typically contain two flash ADCs, and perform analog-to-digital conversion in two stages. The first, coarse stage determines a voltage subrange where the signal input voltage exists, and then the second, fine stage determines where in the subrange the signal input voltage exists. Thus, in a subranging ADC with N binary output bits, the first stage can calculate the most-significant first half of the bits, and the second stage can calculate the least-significant second half of the bits. Because the conversion is done in two stages, the number of voltage comparators used can be reduced from $2^N-1$ (as is the case in a flash ADC, for instance circuit 100) to $2*(2^{(N/2)}-1)$. For example, a pure flash ADC designed to calculate an 8-bit binary output would require 255 voltage comparators, whereas a subranging ADC designed to calculate the same result would require only 30 voltage comparators. While the attendant reduction in circuit size is laudable, the time required to split the conversion process into two steps makes subranging ADCs completely unsuitable for high-speed applications.

Therefore, there is an intense need in the art for analog-to-digital conversion circuits that can provide speed and accuracy, and further reduce the circuit size, power and cost.

SUMMARY OF THE INVENTION

There is provided methods and circuits for a time domain interpolation scheme for flash analog-to-digital converters, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

4

DETAILED DESCRIPTION OF THE INVENTION

Although the invention is described with respect to specific embodiments, the principles of the invention can obviously be applied beyond the specifically described embodiments of the invention described herein. Moreover, in the description of the present invention, certain details have been left out to not obscure the inventive aspects of the invention. The details left out are within the knowledge of a person of ordinary skill in the art. The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
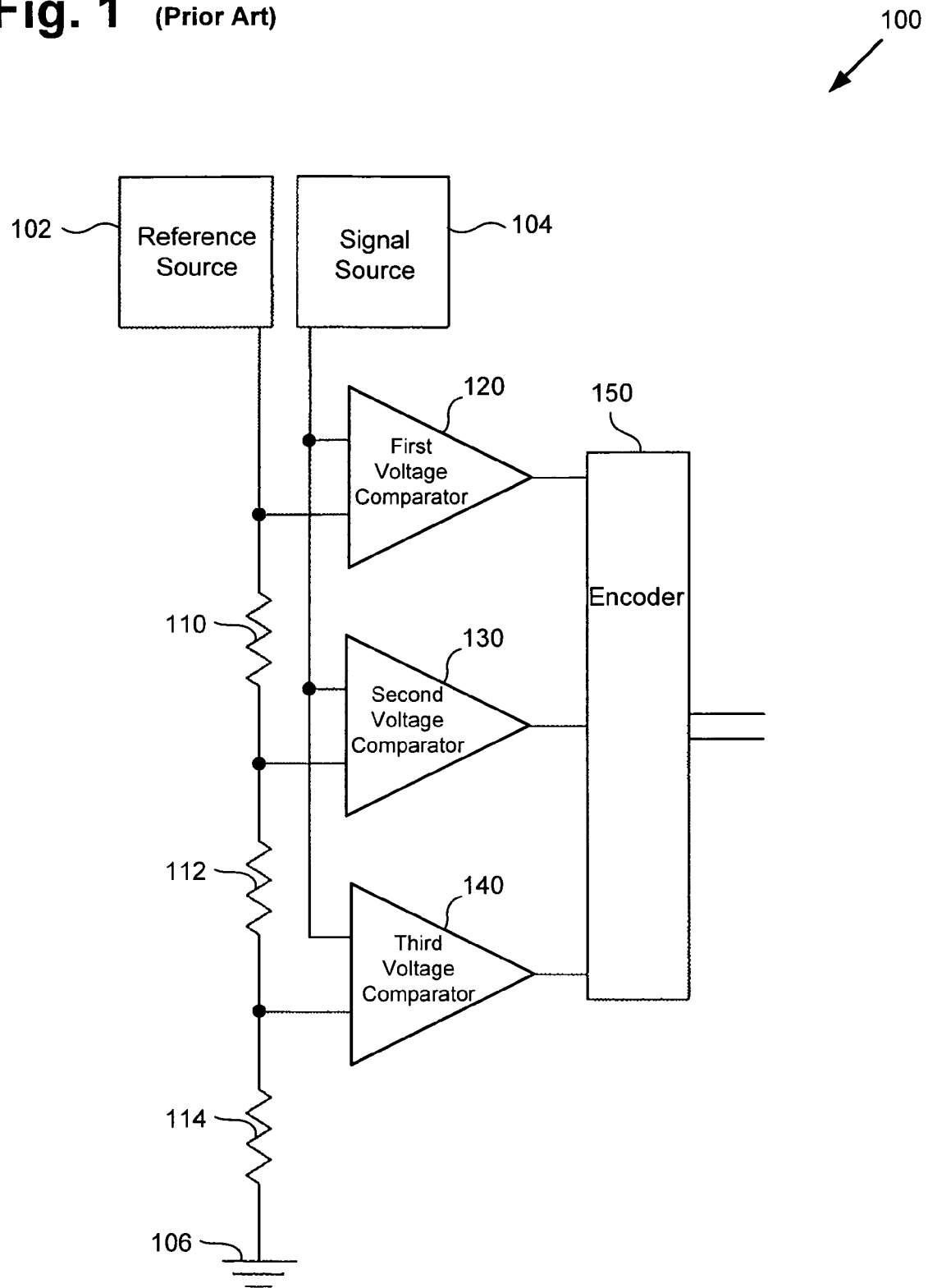
FIG. 1 shows a conventional circuit for flash analog-to-digital conversion.
Figure 2:
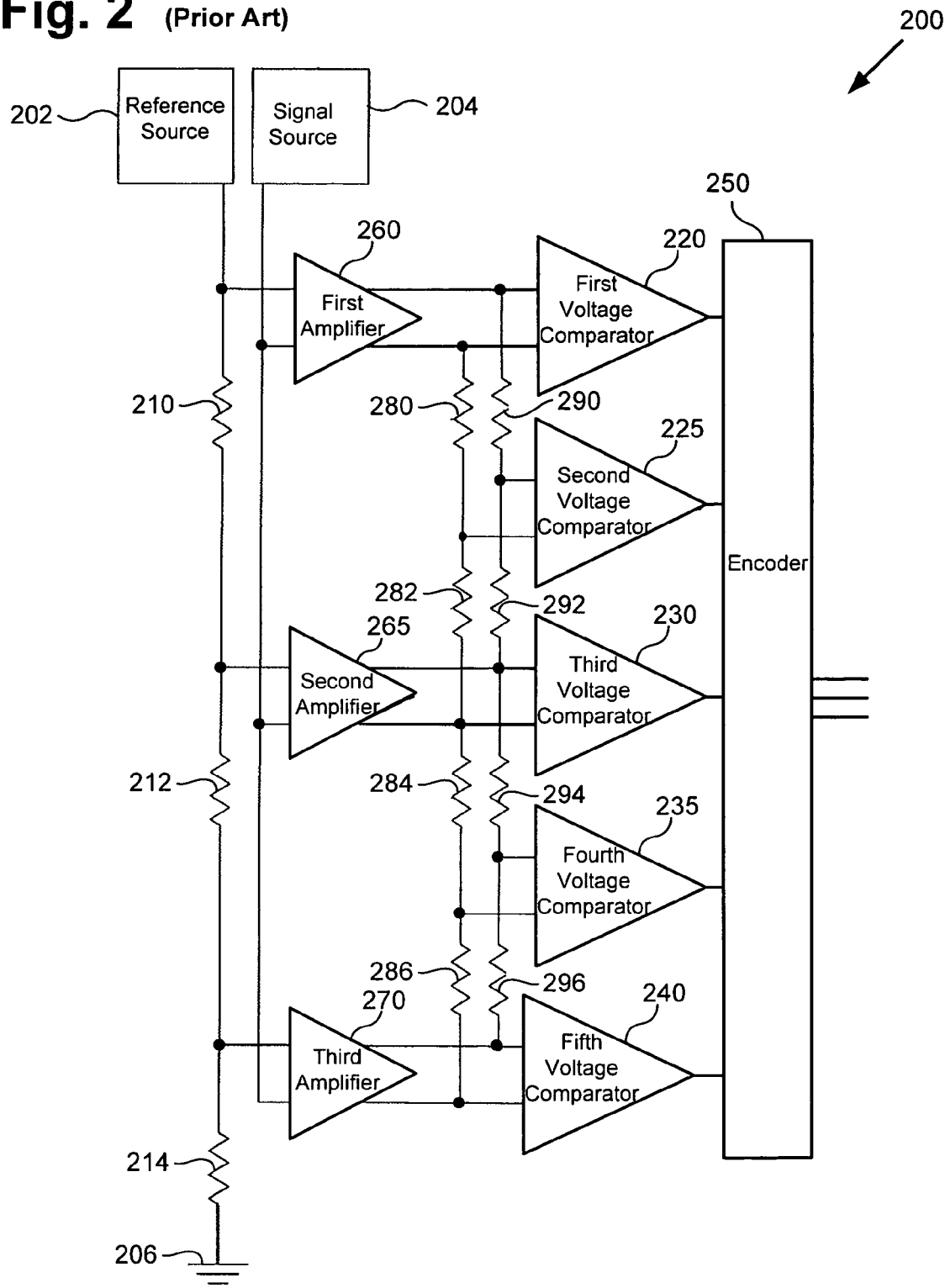
FIG. 2 shows a conventional circuit for interpolating analog-to-digital conversion.
Figure 3:
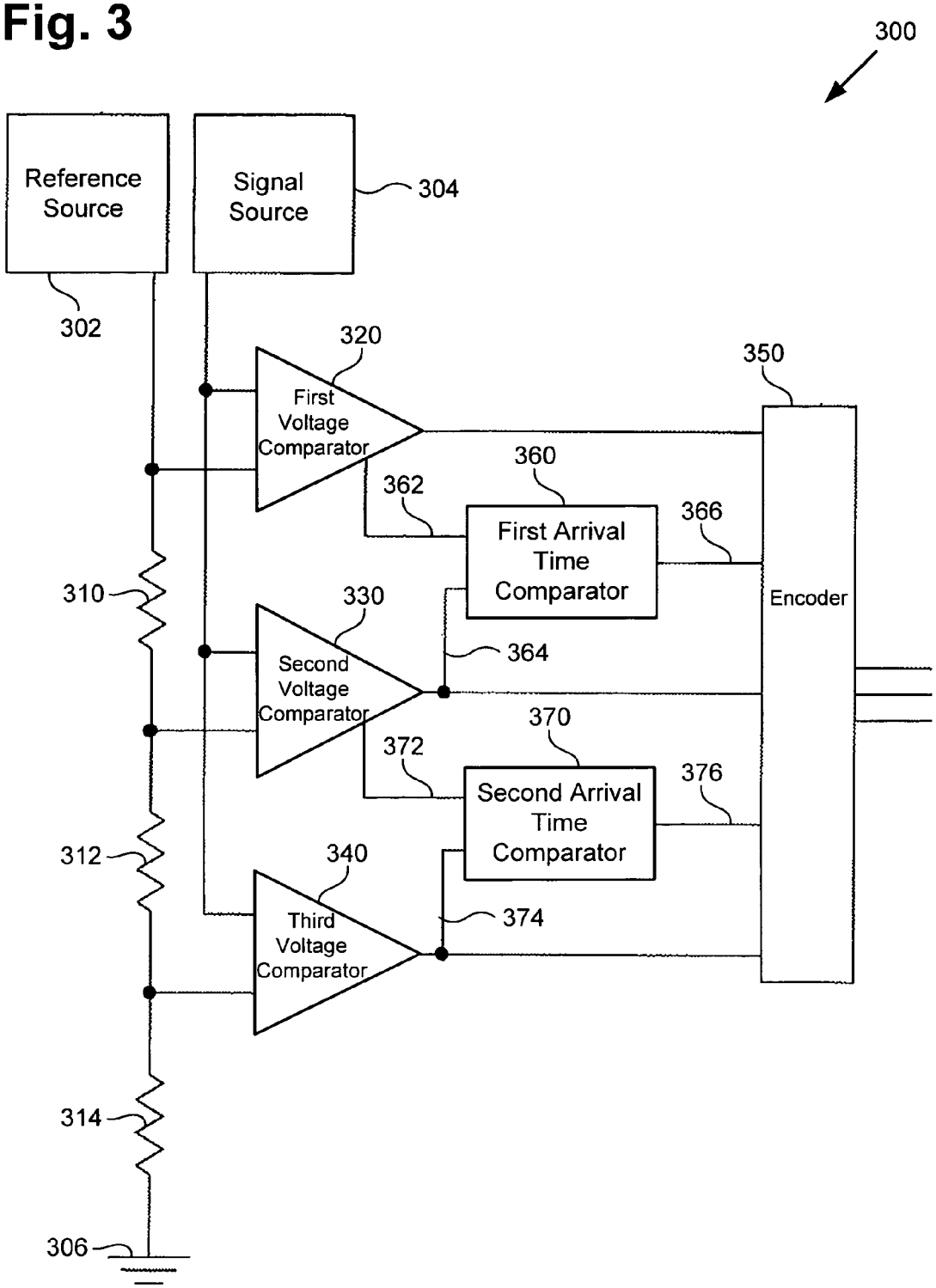
FIG. 3 shows a circuit for flash analog-to-digital conversion, in accordance with one embodiment of the invention.

FIG. 3 illustrates a diagram of circuit 300 for performing analog-to-digital conversion, in accordance with one embodiment of the invention. In operation, reference source 302 can provide a fixed reference voltage to circuit 300. The output of reference source 302 is coupled to the first end of resistor 310, the second end of resistor 310 is coupled to the first end of resistor 312, the second end of resistor 312 is coupled to the first end of resistor 314, and the second end of resistor 314 is coupled to ground 306. In this configuration, resistors 310 through 314 form a voltage divider, and a fixed voltage at a level between the reference source 302 voltage and the ground 306 voltage can exist between the second end and first end of each resistor pair. The voltage between resistors 310 and 312 is lower than the reference source 302 voltage, and the voltage between resistors 312 and 314 is lower than the voltage between resistors 310 and 312.

First voltage comparator 320, second voltage comparator 330, and third voltage comparator 340 each has a reference input, a signal input, a positive output, and a negative output. The reference input and the signal input of each voltage comparator can receive analog voltage signals, which in operation are then compared by the voltage comparator. If the reference input voltage is higher than the signal input voltage, the positive output will be set to logic low, while the negative output will be set to logic high. Conversely, if the reference input voltage is lower than the signal input voltage, the positive output will be set to logic high, while the negative output will be set to logic low. The voltage comparators in this embodiment may be based on regenerative latches, preamplifiers followed by regenerative latches, pairs of cascaded regenerative latches, or other suitable voltage comparator circuits.

The reference input of first voltage comparator 320 is coupled to reference source 302 and to the first end of resistor 310, the reference input of second voltage comparator 330 is coupled to the second end of resistor 310 and the first end of resistor 312, and the reference input of third voltage comparator 340 is coupled to the second end of resistor 312 and the first end of resistor 314. In this configuration, the reference inputs of voltage comparators 320 through 340 each receive a different voltage from the voltage divider. The output of signal source 304 is coupled to the signal input of first voltage comparator 320, to the signal input of second voltage comparator 330, and to the signal input of third voltage comparator 340. In this configuration, the signal inputs of voltage comparators 320 through 340 each receive the same voltage from the output of signal source 304. In this embodiment, the positive outputs of first voltage comparator 320, second voltage comparator 330, and third voltage comparator 340 are each coupled to encoder 350 inputs.

Figure 4:
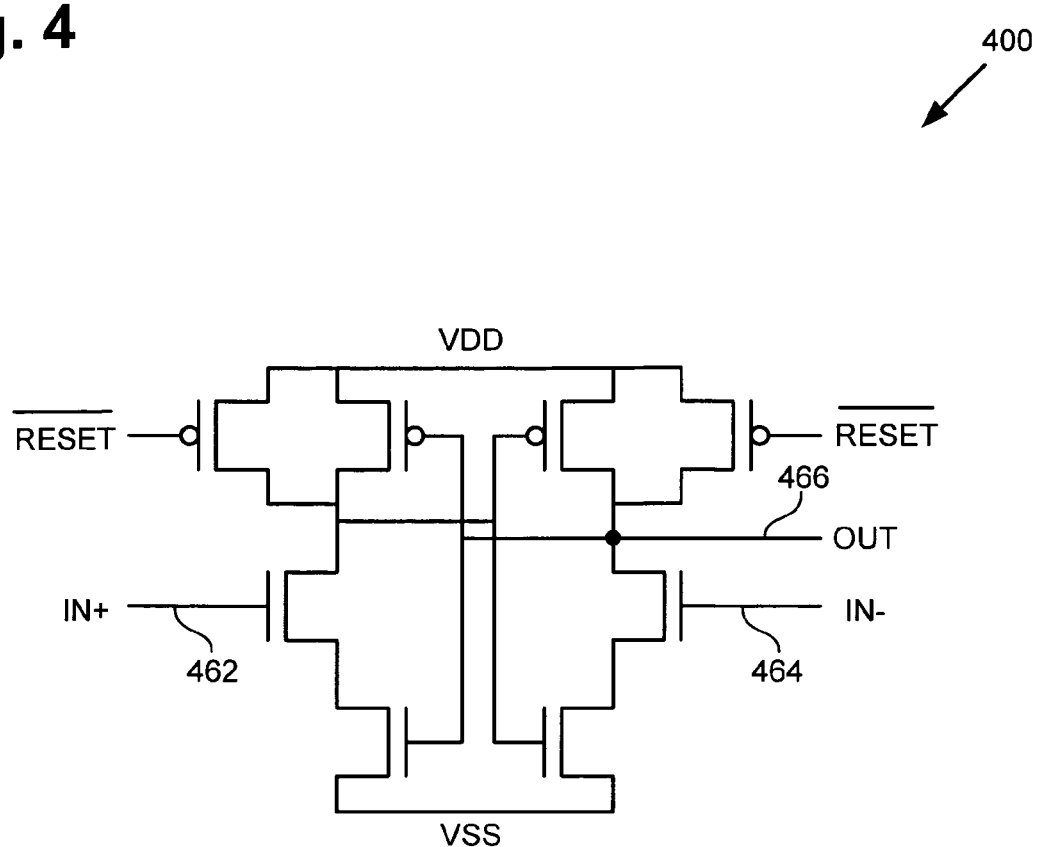
FIG. 4 shows an arrival time comparison circuit for use in the flash analog-to-digital conversion circuit of FIG. 3, in accordance with one embodiment of the invention.

First arrival time comparator 360 and second arrival time comparator 370 each has a positive input, a negative input, and an arrival time comparator output. In operation, the positive input and the negative input of each arrival time comparator can receive logic signals, which can be compared based on arrival time. If the positive input logic signal arrives before the negative input logic signal, the arrival time comparator output will be set to logic high. Conversely, if the positive input logic signal arrives after the negative input logic signal, the arrival time comparator output will be set to logic low. The arrival time comparators may, in this embodiment, be implemented with a regenerative latch such as the one illustrated by FIG. 4. Circuit 400 includes a plurality of transistors, connected as shown in FIG. 4, which operate as understood by one of ordinary skill in the art. Input 462 and input 464 correspond to negative input 362 and positive input 364 of circuit 300, while output 466 corresponds to first arrival time comparator output 366 of circuit 300.

Negative input 362 of first arrival time comparator 360 is coupled to the negative output of first voltage comparator 320, while positive input 364 of first arrival time comparator 360 is coupled to the positive output of second voltage comparator 330. Negative input 372 of second arrival time comparator 370 is coupled to the negative output of second voltage comparator 330, while positive input 374 of second arrival time comparator 370 is coupled to the positive output of third voltage comparator 340. In this embodiment, arrival time comparator output 366 of first arrival time comparator 360 and arrival time comparator output 376 of second arrival time comparator 370 are each coupled to encoder 350 inputs.

In operation, signal source 304 can provide an analog voltage to circuit 300 for conversion to a digital (i.e. logic level) voltage. The voltage output by signal source 304 may be higher or lower than the voltage received by the reference inputs of voltage comparators 320 through 340. For instance, reference input of first voltage comparator 320 receives the reference source 302 voltage. If the reference source 302 voltage is higher than the signal source 304 voltage received by the signal input of first voltage comparator 320, the first voltage comparator 320 positive output will be set to logic low, and first voltage comparator 320 negative output will be set to logic high. Second voltage comparator 330 and third voltage comparator 340 will perform similar comparisons.

Because of the structure of the voltage divider assembled from resistors 310 through 314, the voltage received by the reference input of second voltage comparator 330 is lower than the voltage received by the reference input of first voltage comparator 320, and the voltage received by the reference input of third voltage comparator 340 is lower than the voltage received by the reference input of second voltage comparator 330. Consequently, if the signal source 304 voltage is high enough to make first voltage comparator 320 positive output a logic high, the positive outputs of second and third voltage comparators 330 and 340 will also be logic high. Similarly, if the signal source 304 voltage is not high enough to make first voltage comparator 320 positive output a logic high, but is high enough to make second voltage comparator 330 positive output a logic high, then third voltage comparator 340 positive output will also be logic high.

In this embodiment, the positive outputs and negative outputs of voltage comparator 320 through 340 may be clocked outputs. To have clocked outputs, each voltage comparator can have a clock signal input, and each voltage comparator can be configured to change output only during a certain point of each clock cycle received, for instance, on the rising edge of the clock signal. For example, if first voltage comparator 320 receives a clock signal input as well as a reference input and a signal input, then changes in the signal source 304 output analog voltage will be reflected on first voltage comparator 320 positive and negative outputs subsequently, during each appropriate point in the clock signal period. It should be noted that, in one embodiment of the present invention (not shown), each voltage comparator 320 through 340, may only have one output, such as a negative output or a positive output. For example, first voltage comparator 320 may have only have a positive output, and second voltage comparator 330 may only have a negative output.

Figure 5:
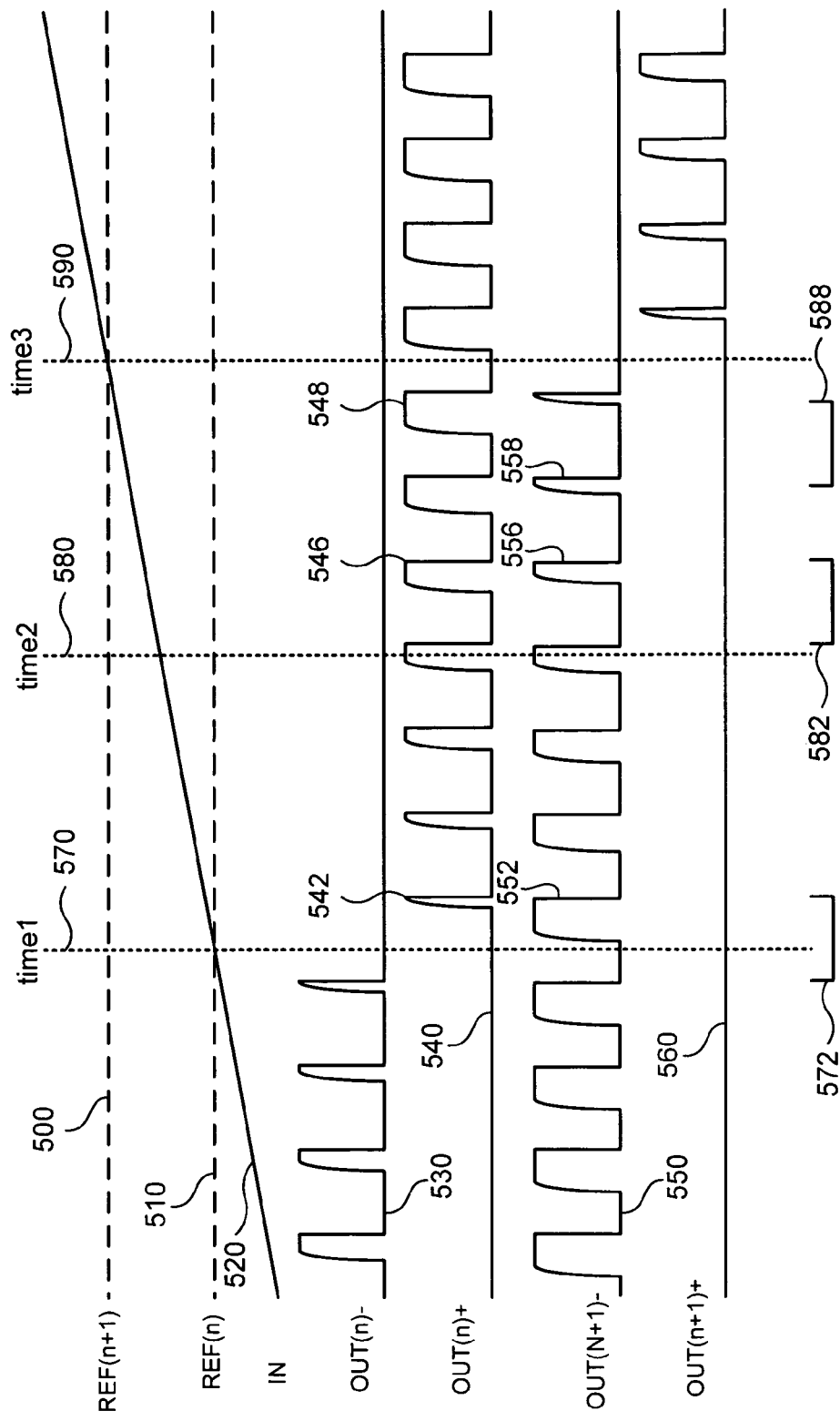
FIG. 5 shows a waveform diagram that illustrates voltage comparator input and output signals for the flash analog-to-digital conversion circuit of FIG. 3, in accordance with one embodiment of the invention.

FIG. 5 illustrates several waveforms that correspond, in this embodiment, to inputs and outputs of two adjacent voltage comparators in circuit 300 during operation. For example, signal REF(1) 500 corresponds to the reference input of first voltage comparator 320 provided by the voltage divider, and signal REF(2) 510 represent the reference input of second voltage comparator 330 provided by the voltage divider. Signal IN 520 represents the signal source 304 output voltage that increases over time and that is present on the signal inputs of both voltage comparators 320 and 330. The negative output of second voltage comparator 330 is shown by signal OUT(2)– 530, while the positive output of second voltage comparator 330 is shown by signal OUT(2)+ 540. Similarly, the negative output of first voltage comparator 320 is shown by signal OUT(1)– 550, while the positive output of first voltage comparator 320 is shown by signal OUT(1)+ 560. While input signals REF(1) 500, REF(2) 510 and IN 520 are analog voltages, signals OUT(2)– 530, OUT(2)+ 540, OUT(1)– 550, and OUT(1)+ 560 are clocked logic voltages.

As signal IN 520 increases over time, signal IN 520 surpasses reference signal REF(2) 510 at time1 570 and surpasses reference signal REF(1) 500 at time3 590. Therefore, at time1 570, the signal input of second voltage comparator 330 exceeds the reference input of second voltage comparator 330, and second voltage comparator 330 stops setting the negative output of second voltage comparator 330 high and starts setting the positive output of second voltage comparator 330 high; this change can be witnessed at time1 570 when the signal OUT(2)– 530 clocked waveform ceases, and the signal OUT(2)+ 540 clocked waveform begins. Similarly, at time3 590 when signal IN 520 surpasses REF(1) 500, the signal OUT(1)– 550 clocked waveform ceases and the signal OUT(1)+ 560 clocked waveform begins.

Because signals 530 through 560 are logic level signals, they may assume only logic high or logic low voltage levels. As such, signals 530 through 560 each convey only one bit of information via their magnitude. However, in this embodiment, signals 530 through 560 can convey more than one bit of information, because they each also carry information via their pulse width. In this embodiment, when first voltage comparator 320 makes a comparison between reference input of voltage comparator 320 and signal input of voltage comparator 320, the time required to complete the comparison is inversely proportional to the magnitude of the difference between the signal input voltage and the reference input voltage. This phenomenon is evident in output waveforms 542, 552, 548, and 558. Immediately subsequent to time1 570, signal IN 520 voltage is only a little larger than signal REF(2) 510 voltage. As a consequence, the positive output of second voltage comparator 330 at output waveform 542 takes a large proportion of clock period 572 to change from logic low to logic high. In contrast, the negative output of first voltage comparator 320 at output waveform 552 takes a shorter proportion of clock period 572 to change from logic low to logic high. Later in time, immediately prior to time3 590, signal IN 520 voltage is much higher than signal REF(2) 510 voltage, and has almost crossed signal REF(1) 500 voltage. As a consequence, the positive output of second voltage comparator 330 at output waveform 548 takes a short proportion of clock period 588 to change from logic low to logic high. In contrast, the negative output of first voltage comparator 320 at output waveform 558 takes a longer proportion of clock period 588 to change from logic low to logic high. This difference in proportion of clock period consumed before making logic transition contains useful information about the difference between the signal IN 520 input and the various reference inputs, and this information can be utilized by first and second arrival time comparators 360 and 370 to decide whether to set a logic low or logic high arrival time comparator output.

For instance, during clock period 572, the rising edge of output waveform 542 is received by the positive input of first arrival time comparator 360 after the rising edge of output waveform 552 is received by the negative input of first arrival time comparator 360. From this, it follows that signal IN 520 is large enough to activate the positive output of second voltage comparator 330, too small to activate the positive output of first voltage comparator 320, and not large enough to be halfway between the reference inputs of both voltage comparators 320 and 330. Thus, first arrival time comparator output 366 remains set at logic low. Some time later, after time2 580 and during clock period 582, the rising edge of output waveform 546 is received by the positive input of first arrival time comparator 360 before the rising edge of output waveform 556 is received by the negative input of first arrival time comparator 360. From this, it follows that signal IN 520 has the same effect on the positive outputs of first and second voltage comparator 320 and 330 that it did during clock period 572, but now signal IN 520 is large enough to have crossed over half the distance between reference inputs of first and second voltage comparator 320 and 330. Thus, first arrival time comparator output 366 changes to be set at logic high, thereby interpolating an intermediate voltage level between the positive outputs of first and second voltage comparators 320 and 330.

The result of the analog-to-digital conversion is represented by the cardinality of voltage comparator positive outputs and arrival time comparator outputs that are set logic high. For instance, if in operation the signal source 304 voltage exceeds the reference source 302 voltage, then each voltage comparator positive output will be set logic high, because the signal input of each voltage comparator receives a voltage that exceeds the voltage received by the reference input of each voltage comparator, and each arrival time comparator output will be set logic high, because the positive input of each arrival time comparator is logic high while the negative input of each arrival time comparator is logic low (i.e., the rising edge of the waveforms received by the positive input of each arrival time comparator arrive "before" the logic low signal received by the negative input of each arrival time comparator). Thus, in this example, in circuit 300 the cardinality of voltage comparator positive outputs and arrival time comparator outputs that are set logic high is 5. However, if the signal source 304 voltage is reduced below the reference source 302 voltage, but remains above the voltage between the second end of resistor 310 and the first end of resistor 312, then the first voltage comparator 320 positive output will be set logic low, while the remaining voltage comparator 330 and 340 positive outputs will continue to be logic high. Depending on whether the signal source 304 voltage is closer to the reference input voltage of first voltage comparator 320 or second voltage comparator 330, first arrival time comparator output 366 will be either logic high or logic low, respectively. In this fashion, the cardinality of voltage comparator positive outputs and arrival time comparator outputs that are set logic high, and thus the result of the analog-to-digital conversion, declines from 5 to either 4 or 3 as the signal source 304 voltage declines as described. In circuit 300, this cardinal output (i.e., a base-1 output, or "thermometer code") can be converted by encoder 350 to, for instance, a binary number (i.e., a base-2 output).

Figure 6:
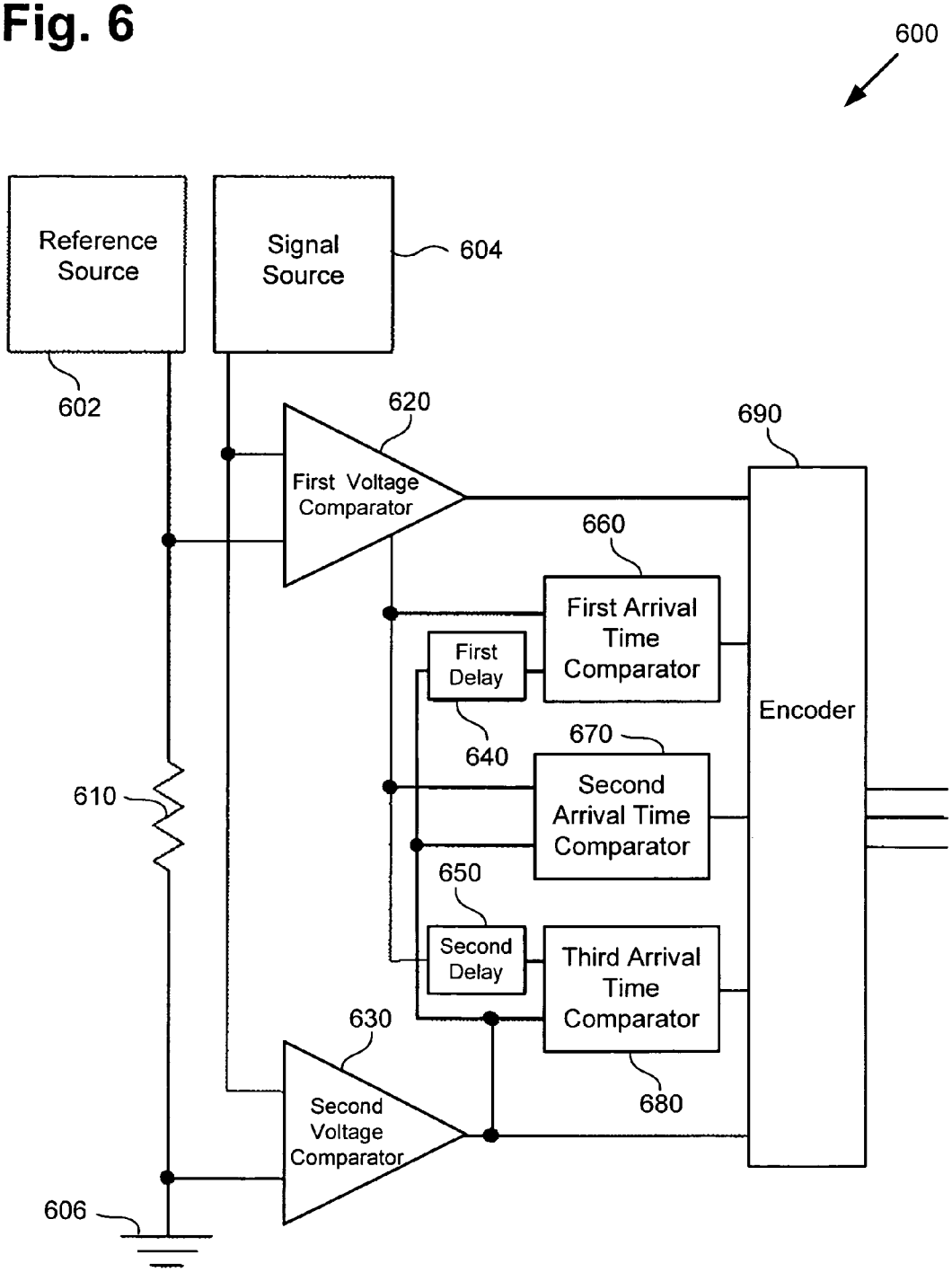
FIG. 6 shows a circuit for flash analog-to-digital conversion, in accordance with another embodiment of the invention.

In another embodiment of the invention, as shown in FIG. 6, more than one arrival time comparator can be utilized between a pair of voltage comparators. By adding a delay and additional arrival time comparator(s), additional intermediate voltage(s) can be interpolated. A primary difference between circuit 300 and circuit 600 is the addition of first arrival time comparator 660, third arrival time comparator 680, first delay 640, and second delay 650 between first voltage comparator 620 and second voltage comparator 630. In order not to obscure the differences between circuit 300 and circuit 600, a third voltage comparator has been omitted.

The reference input of first voltage comparator 620 is coupled between reference source 602 and the first end of resistor 610, while the reference input of second voltage comparator 630 is coupled between the second end of resistor 610 and ground 606. The signal inputs of first and second voltage comparator 620 and 630 are coupled to the output of signal source 604. The second arrival time comparator 670 negative input is coupled to the negative output of first voltage comparator 620, and the second arrival time comparator 670 positive input is coupled to the positive output of second voltage comparator 630. The input of first delay 640 is coupled to the positive output of second voltage comparator 630, and the input of second delay 650 is coupled to the negative output of first voltage comparator 620. The negative input of first arrival time comparator 660 is coupled to the negative output of first voltage comparator 620, and the positive input of first arrival time comparator 660 is coupled to the output of first delay 640. The negative input of third arrival time comparator 680 is coupled to the output of second delay 650, and the positive input of third arrival time comparator 680 is coupled to the positive output of second voltage comparator 630.

Delay 640 and delay 650 are, in this embodiment, designed to time-delay the logic signal each receives. Thus, first delay 640 receives and stores the positive output of second voltage comparator 630, waits for a period of time, and then sets first delay 640 output to equal the stored first delay 640 input. Similarly, second delay 650 receives and stores the negative output of first voltage comparator 620, waits for a period of time, and then sets second delay 650 output to equal the stored second delay 650 input. With a properly calibrated second delay 650, third arrival time comparator 680 output can be set to logic high at a signal source 604 voltage that is one-quarter the difference between reference source 602 voltage and ground 606 voltage. Similarly, with a properly calibrated first delay 640, first arrival time comparator 660 output can be set logic high at a signal source 604 voltage that is three-quarters the difference between reference source 602 voltage and ground 606 voltage. Because the inputs of second arrival time comparator 670 are not delayed in this embodiment, second arrival time comparator 670 continues to behave like corresponding first arrival time comparator 320 of circuit 300, and sets output to be logic high at a signal source 604 voltage that is one-half the difference between reference source 602 voltage and ground 606 voltage. Thus, in this embodiment the three arrival time comparators may interpolate three intermediate voltage levels. Other embodiments of the invention could use different delay and arrival time comparator combinations to generate arbitrary numbers of new interpolation levels between adjacent voltage comparator pairs. For example, in one embodiment, only one delay module may be utilized.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, it is contemplated that the circuitry disclosed herein can be implemented in software, or vice versa. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. An analog-to-digital converter circuit comprising:
 a first voltage comparator coupled to a first reference voltage and a signal voltage, the first voltage comparator having a first negative output and a first positive output for outputting a comparison of the first reference voltage with the signal voltage;
 a second voltage comparator coupled to a second reference voltage and the signal voltage, the second reference voltage being different than the first reference voltage, the second voltage comparator having a second negative output and a second positive output for outputting a comparison of the second reference voltage with the signal voltage; and
 a first arrival time comparator coupled to the first positive output and the second negative output, the first arrival time comparator having a first arrival time comparator output for outputting a comparison of the first positive output with the second negative output.

2. The analog-to-digital converter circuit of claim 1 further comprising:
 a third voltage comparator coupled to a third reference voltage and the signal voltage, the third reference voltage being different than the first reference voltage and the second reference voltage, the third voltage comparator having a third negative output and a third positive output for outputting a comparison of the third reference voltage with the signal voltage; and
 a second arrival time comparator coupled to the second positive output and the third negative output, the second arrival time comparator having a second arrival time comparator output for outputting a comparison of the second positive output with the third negative output.

3. The analog-to-digital converter circuit of claim 1, further comprising:
 a first delay coupled to the first positive output, the first delay having a first delay output for outputting the first positive output after a delay time; and
 a second arrival time comparator coupled to the second negative output and the first delay output, the second arrival time comparator having a second arrival time comparator output for outputting a comparison of the second negative output with the first delay output.

4. The analog-to-digital converter circuit of claim 1, further comprising:
 a first delay coupled to the second negative output, the first delay having a first delay output for outputting the second negative output after a delay time; and
 a second arrival time comparator coupled to the first positive output and the first delay output, the second arrival time comparator having a second arrival time comparator output for outputting a comparison of the first positive output with the first delay output.

5. The analog-to-digital converter circuit of claim 1, further comprising:
 a first delay coupled to the first positive output, the first delay having a first delay output for outputting the first positive output after a delay time;
 a second delay coupled to the second negative output, the second delay having a second delay output for outputting the second negative output after a delay time;
 a second arrival time comparator coupled to the first positive output and the second delay output, the second arrival time comparator having a second arrival time comparator output for outputting a comparison of the first positive output with the second delay output; and
 a third arrival time comparator coupled to the second negative output and the first delay output, the third arrival time comparator having a third arrival time comparator output for outputting a comparison of the second negative output with the first delay output.

6. The analog-to-digital converter circuit of claim 1, wherein the first voltage comparator is based on a regenerative latch, and the second voltage comparator is based on a regenerative latch.

7. The analog-to-digital converter circuit of claim 1, wherein the first voltage comparator is based on a preamplifier followed by a regenerative latch, and the second voltage comparator is based on a preamplifier followed by a regenerative latch.

8. The analog-to-digital converter circuit of claim 1, wherein the first voltage comparator is based on a plurality of cascaded regenerative latches, and the second voltage comparator is based on a plurality of cascaded regenerative latches.

9. The analog-to-digital converter circuit of claim 1, wherein the first voltage comparator has a symmetric internal structure providing both positive and negative output signals, and the second voltage comparator has a symmetric internal structure providing both positive and negative output signals.

10. The analog-to-digital converter circuit of claim 1, wherein the first arrival time comparator is a regenerative latch.

11. A method of analog-to-digital conversion comprising:
 comparing a first reference voltage with a signal voltage;
 outputting a first negative output and a first positive output based on comparing the first reference voltage with the signal voltage;
 comparing a second reference voltage with the signal voltage, the second reference voltage being different than the first reference voltage;
 outputting a second negative output and a second positive output based on comparing the second reference voltage with the signal voltage;
 comparing the first positive output with the second negative output; and
 outputting a first arrival time comparator output based on comparing the first positive output with the second negative output.

12. The method of analog-to-digital conversion of claim 11, further comprising:
 comparing a third reference voltage with the signal voltage, the third reference voltage being different than the first reference voltage and the second reference voltage;

outputting a third negative output and a third positive output based on comparing the third reference voltage with the signal voltage;

comparing the second positive output with the third negative output; and outputting a second arrival time comparator output based on comparing the second positive output with the third negative output.

13. The method of analog-to-digital conversion of claim 11, further comprising:

delaying the first positive output;

outputting a first delay output based on delaying the first positive output;

comparing the first delay output with the second negative output; and outputting a second arrival time comparator output based on comparing the first delay output with the second negative output.

14. The method of analog-to-digital conversion of claim 11, further comprising:

delaying the second negative output;

outputting a first delay output based on delaying the second negative output;

comparing the first delay output with the first positive output; and outputting a second arrival time comparator output based on comparing the first delay output with the first positive output.

15. The method of analog-to-digital conversion of claim 11, further comprising:

delaying the first positive output;

outputting a first delay output based on delaying the first positive output;

comparing the first delay output with the second negative output;

outputting a second arrival time comparator output based on comparing the first delay output with the second negative output;

delaying the second negative output;

outputting a second delay output based on delaying the second negative output;

comparing the second delay output with the first positive output; and outputting a third arrival time comparator output based on comparing the second delay output with the first positive output.

16. The method of analog-to-digital conversion of claim 11, wherein the comparison of the first reference voltage with the signal voltage is performed by a first voltage comparator based on a regenerative latch, and the comparison of the second reference voltage with the signal voltage is performed by a second voltage comparator based on a regenerative latch.

17. The method of analog-to-digital conversion of claim 11, wherein the comparison of the first reference voltage with the signal voltage is performed by a first voltage comparator based on a preamplifier followed by a regenerative latch, and the comparison of the second reference voltage with the signal voltage is performed by a second voltage comparator based on a preamplifier followed by a regenerative latch.

18. The method of analog-to-digital conversion of claim 11, wherein the comparison of the first reference voltage with the signal voltage is performed by a first voltage comparator based on a plurality of cascaded regenerative latches, and the comparison of the second reference voltage with the signal voltage is performed by a second voltage comparator based on a plurality of cascaded regenerative latches.

19. The method of analog-to-digital conversion of claim 11, wherein the comparison of the first reference voltage with the signal voltage is performed by a first voltage comparator that has a symmetric internal structure providing both positive and negative output signals, and the comparison of the second reference voltage with the signal voltage is performed by a second voltage comparator that has a symmetric internal structure providing both positive and negative output signals.

20. An analog-to-digital converter circuit comprising:

a first voltage comparator coupled to a first reference voltage and a signal voltage, the first voltage comparator having a first positive output for outputting a comparison of the first reference voltage with the signal voltage;

a second voltage comparator coupled to a second reference voltage and the signal voltage, the second reference voltage being different than the first reference voltage, the second voltage comparator having a second negative output for outputting a comparison of the second reference voltage with the signal voltage; and a first arrival time comparator coupled to the first positive output and the second negative output, the first arrival time comparator having a first arrival time comparator output for outputting a comparison of the first positive output with the second negative output.

* * * * *